(12) United States Patent
Zahurak et al.

(10) Patent No.: US 9,269,795 B2
(45) Date of Patent: Feb. 23, 2016

(54) CIRCUIT STRUCTURES, MEMORY CIRCUITRY, AND METHODS

(71) Applicant: Micron Technology, Inc., Boise, ID (US)

(72) Inventors: John K. Zahurak, Eagle, ID (US); Sanh D. Tang, Boise, ID (US); Lars P. Heineck, Garden City, ID (US); Martin C. Roberts, Boise, ID (US); Wolfgang Mueller, Garden City, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/287,659

(22) Filed: May 27, 2014

(65) Prior Publication Data

US 2014/0273358 A1    Sep. 18, 2014

Related U.S. Application Data

(62) Division of application No. 13/191,293, filed on Jul. 26, 2011, now Pat. No. 8,772,848.

(51) Int. Cl.
  *H01L 29/66*  (2006.01)
  *H01L 27/12*  (2006.01)
  (Continued)

(52) U.S. Cl.
  CPC .......... *H01L 29/66969* (2013.01); *H01L 21/84* (2013.01); *H01L 27/10802* (2013.01);
  (Continued)

(58) Field of Classification Search
  None
  See application file for complete search history.

(56) References Cited

U.S. PATENT DOCUMENTS 3,988,771 A    10/1976    Krishna
4,487,639 A    12/1984    Lam et al.
(Continued)

FOREIGN PATENT DOCUMENTS

CN        101621036        1/2010
CN    201180011589.X       8/2014
(Continued)

OTHER PUBLICATIONS

"IBM Builds World's Fastest Communications Microchip", Reuters U.S. Company News, Feb. 25, 2002, http://activequote300.fidelity.com/rtrnews/—individual—n . . . / . . . , 1 pg.
(Continued)

*Primary Examiner* — Khaja Ahmad
(74) *Attorney, Agent, or Firm* — Wells St. John, P.S.

(57) ABSTRACT

A circuit structure includes a substrate having an array region and a peripheral region. The substrate in the array and peripheral regions includes insulator material over first semiconductor material, conductive material over the insulator material, and second semiconductor material over the conductive material. The array region includes vertical circuit devices which include the second semiconductor material. The peripheral region includes horizontal circuit devices which include the second semiconductor material. The horizontal circuit devices in the peripheral region individually have a floating body which includes the second semiconductor material. The conductive material in the peripheral region is under and electrically coupled to the second semiconductor material of the floating bodies. Conductive straps in the array region are under the vertical circuit devices. The conductive straps include the conductive material and individually are electrically coupled to a plurality of the vertical circuit devices in the array region. Other implementations are disclosed.

14 Claims, 9 Drawing Sheets

(51) Int. Cl.
*H01L 21/84* (2006.01)
*H01L 29/78* (2006.01)
*H01L 27/108* (2006.01)
*H01L 45/00* (2006.01)
*H01L 27/24* (2006.01)

(52) U.S. Cl.
CPC .... *H01L27/10823* (2013.01); *H01L 27/10876* (2013.01); *H01L 27/10894* (2013.01); *H01L 27/10897* (2013.01); *H01L 27/1203* (2013.01); *H01L 27/2454* (2013.01); *H01L 29/7841* (2013.01); *H01L 45/04* (2013.01); *H01L 45/06* (2013.01); *H01L 45/1233* (2013.01); *H01L 45/14* (2013.01); *H01L 45/145* (2013.01); *H01L 45/146* (2013.01); *H01L 45/16* (2013.01)

(56) References Cited

U.S. PATENT DOCUMENTS

| | | | |
|---|---|---|---|
| 5,098,861 | A | 3/1992 | Blackstone |
| 5,102,821 | A | 4/1992 | Moslehi |
| 5,106,776 | A | 4/1992 | Shen et al. |
| 5,373,184 | A | 12/1994 | Moslehi |
| 5,378,316 | A | 1/1995 | Franke et al. |
| 5,412,598 | A | 5/1995 | Shulman |
| 5,465,249 | A | 11/1995 | Cooper, Jr. et al. |
| 5,471,039 | A | 11/1995 | Irwin, Jr. et al. |
| 5,510,630 | A | 4/1996 | Agarwal et al. |
| 5,563,084 | A | 10/1996 | Ramm et al. |
| 5,600,160 | A | 2/1997 | Hvistendahl |
| 5,874,760 | A | 2/1999 | Burns, Jr. et al. |
| 5,904,507 | A | 5/1999 | Thomas |
| 5,920,105 | A | 7/1999 | Okamoto et al. |
| 5,930,640 | A | 7/1999 | Kenney |
| 5,936,274 | A | 8/1999 | Forbes et al. |
| 5,963,469 | A | 10/1999 | Forbes |
| 6,017,778 | A | 1/2000 | Pezzani |
| 6,033,957 | A | 3/2000 | Burns, Jr. et al. |
| 6,137,128 | A | 10/2000 | Holmes et al. |
| 6,191,476 | B1 | 2/2001 | Takahashi et al. |
| 6,225,151 | B1 | 5/2001 | Gardner et al. |
| 6,225,165 | B1 | 5/2001 | Noble, Jr. et al. |
| 6,229,161 | B1 | 5/2001 | Nemati et al. |
| 6,245,663 | B1 | 6/2001 | Zhao et al. |
| 6,255,731 | B1 | 7/2001 | Ohmi et al. |
| 6,274,888 | B1 | 8/2001 | Suzuki et al. |
| 6,294,418 | B1 | 9/2001 | Noble |
| 6,303,468 | B1 | 10/2001 | Aspar et al. |
| 6,335,231 | B1 | 1/2002 | Yamazaki et al. |
| 6,335,258 | B1 | 1/2002 | Aspar et al. |
| 6,352,894 | B1 | 3/2002 | Goebel et al. |
| 6,355,501 | B1 | 3/2002 | Fung et al. |
| 6,355,520 | B1 | 3/2002 | Park et al. |
| 6,365,488 | B1 | 4/2002 | Liao |
| 6,391,658 | B1 | 5/2002 | Gates et al. |
| 6,492,662 | B2 | 12/2002 | Hsu et al. |
| 6,559,471 | B2 | 5/2003 | Finder et al. |
| 6,576,944 | B2 | 6/2003 | Weis |
| 6,593,624 | B2 | 7/2003 | Walker |
| 6,600,173 | B2 | 7/2003 | Tiwari |
| 6,627,924 | B2 | 9/2003 | Hsu et al. |
| 6,649,980 | B2 | 11/2003 | Noguchi |
| 6,653,174 | B1 | 11/2003 | Cho et al. |
| 6,690,038 | B1 | 2/2004 | Cho et al. |
| 6,690,039 | B1 | 2/2004 | Nemati et al. |
| 6,713,791 | B2 | 3/2004 | Hsu et al. |
| 6,713,810 | B1 | 3/2004 | Bhattacharyya |
| 6,727,529 | B2 | 4/2004 | Nemati et al. |
| 6,744,094 | B2 | 6/2004 | Forbes |
| 6,756,286 | B1 | 6/2004 | Moriceau et al. |
| 6,764,774 | B2 | 7/2004 | Grill et al. |
| 6,768,156 | B1 | 7/2004 | Bhattacharyya |
| 6,809,044 | B1 | 10/2004 | Aspar et al. |
| 6,812,504 | B2 | 11/2004 | Bhattacharyya |
| 6,815,781 | B2 | 11/2004 | Vyvoda et al. |
| 6,841,813 | B2 | 1/2005 | Walker et al. |
| 6,845,034 | B2 | 1/2005 | Bhattacharyya |
| 6,870,202 | B2 | 3/2005 | Oka |
| 6,881,994 | B2 | 4/2005 | Lee et al. |
| 6,882,008 | B1 | 4/2005 | Ohsawa |
| 6,891,205 | B1 | 5/2005 | Cho et al. |
| 6,906,354 | B2 | 6/2005 | Hsu et al. |
| 6,914,286 | B2 | 7/2005 | Park |
| 6,934,209 | B2 | 8/2005 | Marr |
| 6,940,748 | B2 | 9/2005 | Nejad et al. |
| 6,940,761 | B2 | 9/2005 | Forbes |
| 6,946,365 | B2 | 9/2005 | Aspar et al. |
| 6,953,953 | B1 | 10/2005 | Horch |
| 6,958,263 | B2 | 10/2005 | Bhattacharyya |
| 6,958,513 | B2 | 10/2005 | Wang |
| 6,965,129 | B1 | 11/2005 | Horch et al. |
| 6,992,349 | B2 | 1/2006 | Lee et al. |
| 6,995,456 | B2 | 2/2006 | Nowak |
| 7,015,092 | B2 | 3/2006 | Jaiprakash et al. |
| 7,029,956 | B2 | 4/2006 | Hsu et al. |
| 7,052,941 | B2 | 5/2006 | Lee |
| 7,075,146 | B2 | 7/2006 | Forbes |
| 7,081,663 | B2 | 7/2006 | Bulucea |
| 7,115,939 | B2 | 10/2006 | Forbes |
| 7,120,046 | B1 | 10/2006 | Forbes |
| 7,129,538 | B2 | 10/2006 | Lee et al. |
| 7,151,024 | B1 | 12/2006 | Forbes |
| 7,157,771 | B2 | 1/2007 | Forbes |
| 7,158,401 | B2 | 1/2007 | Bhattacharyya |
| RE39,484 | E | 2/2007 | Bruel |
| 7,180,135 | B1 | 2/2007 | Ioannou |
| 7,195,959 | B1 | 3/2007 | Plummer et al. |
| 7,205,185 | B2 | 4/2007 | Dokumaci et al. |
| 7,250,628 | B2 | 7/2007 | Bhattacharyya |
| 7,250,646 | B2 | 7/2007 | Walker et al. |
| 7,268,373 | B1 | 9/2007 | Gupta et al. |
| 7,271,052 | B1 | 9/2007 | Forbes |
| 7,279,740 | B2 | 10/2007 | Bhattacharyya et al. |
| 7,304,327 | B1 | 12/2007 | Nemati et al. |
| 7,323,380 | B2 | 1/2008 | Forbes |
| 7,326,969 | B1 | 2/2008 | Horch |
| 7,338,862 | B2 | 3/2008 | Huo et al. |
| 7,358,120 | B2 | 4/2008 | Furukawa et al. |
| 7,359,229 | B2 | 4/2008 | Ferrant et al. |
| 7,362,609 | B2 | 4/2008 | Harrison et al. |
| 7,368,352 | B2 | 5/2008 | Kim et al. |
| 7,378,325 | B2 | 5/2008 | Kaneko et al. |
| 7,410,867 | B2 | 8/2008 | Forbes |
| 7,415,690 | B2 | 8/2008 | Liang et al. |
| 7,456,439 | B1 | 11/2008 | Horch |
| 7,476,939 | B2 | 1/2009 | Okhonin et al. |
| 7,488,627 | B1 | 2/2009 | Nemati et al. |
| 7,491,608 | B2 | 2/2009 | Forbes |
| 7,518,182 | B2 | 4/2009 | Abbott et al. |
| 7,525,137 | B2 | 4/2009 | Walker et al. |
| 7,538,000 | B2 | 5/2009 | Dao |
| 7,560,336 | B2 | 7/2009 | Abbott |
| 7,579,240 | B2 | 8/2009 | Forbes |
| 7,589,995 | B2 | 9/2009 | Tang et al. |
| 7,592,209 | B2 | 9/2009 | Chang |
| 7,615,436 | B2 | 11/2009 | Kouznetsov et al. |
| 7,619,917 | B2 | 11/2009 | Nirschl et al. |
| 7,629,651 | B2 | 12/2009 | Nakajima |
| 7,663,188 | B2 | 2/2010 | Chung |
| 7,736,969 | B2 | 6/2010 | Abbott et al. |
| 7,786,505 | B1 | 8/2010 | Yang et al. |
| 7,816,728 | B2 | 10/2010 | Ho et al. |
| 7,825,455 | B2 | 11/2010 | Lee et al. |
| 7,838,360 | B2 | 11/2010 | Forbes |
| 7,851,859 | B2 | 12/2010 | Tak et al. |
| 7,883,962 | B2 | 2/2011 | Noble |
| 7,897,440 | B1 | 3/2011 | Horch |
| 7,929,343 | B2 | 4/2011 | Tang et al |
| 8,018,058 | B2 | 9/2011 | Lee |
| 8,084,316 | B2 | 12/2011 | Huo et al. |
| 8,102,025 | B2 | 1/2012 | Ozeki et al. |
| 8,148,780 | B2 | 4/2012 | Tang et al. |
| 8,501,559 | B2 | 8/2013 | Tang et al. |

(56) References Cited

U.S. PATENT DOCUMENTS

| | | |
|---|---|---|
| 8,501,581 B2 | 8/2013 | Tang et al. |
| 8,507,966 B2 | 8/2013 | Tang et al. |
| 8,518,812 B2 | 8/2013 | Mariani et al. |
| 8,519,431 B2 | 8/2013 | Nemati et al. |
| 8,558,220 B2 | 10/2013 | Schrinker et al. |
| 8,598,621 B2 | 12/2013 | Tang |
| 8,772,848 B2 | 7/2014 | Zahurak |
| 2001/0002062 A1 | 5/2001 | Noble, Jr. et al. |
| 2001/0024841 A1 | 9/2001 | Noble, Jr. et al. |
| 2001/0026477 A1 | 10/2001 | Manning |
| 2001/0048119 A1 | 12/2001 | Mizuno et al. |
| 2002/0024152 A1 | 2/2002 | Momoi et al. |
| 2002/0028541 A1 | 3/2002 | Lee et al. |
| 2002/0079537 A1 | 6/2002 | Houston |
| 2002/0081753 A1 | 6/2002 | Gates et al. |
| 2002/0094619 A1 | 7/2002 | Mandelman et al. |
| 2002/0142562 A1 | 10/2002 | Chan et al. |
| 2002/0158254 A1 | 10/2002 | Hsu et al. |
| 2002/0163019 A1 | 11/2002 | Mohsen |
| 2002/0185684 A1 | 12/2002 | Campbell et al. |
| 2002/0190265 A1 | 12/2002 | Hsu et al. |
| 2002/0190298 A1 | 12/2002 | Alsmeier et al. |
| 2003/0006461 A1 | 1/2003 | Tezuka et al. |
| 2003/0164501 A1 | 9/2003 | Suzuki et al. |
| 2003/0211705 A1 | 11/2003 | Tong et al. |
| 2003/0223292 A1 | 12/2003 | Nejad et al. |
| 2003/0235710 A1 | 12/2003 | Grill et al. |
| 2004/0022105 A1 | 2/2004 | Ohsawa |
| 2004/0130015 A1 | 7/2004 | Ogihara et al. |
| 2004/0159853 A1 | 8/2004 | Nemati et al. |
| 2004/0174734 A1 | 9/2004 | Forbes |
| 2004/0214379 A1 | 10/2004 | Lee et al. |
| 2004/0233761 A1 | 11/2004 | Schwabe et al. |
| 2004/0262635 A1 | 12/2004 | Lee |
| 2004/0262679 A1 | 12/2004 | Ohsawa |
| 2005/0001232 A1 | 1/2005 | Bhattacharyya |
| 2005/0037582 A1 | 2/2005 | Dennard et al. |
| 2005/0146955 A1 | 7/2005 | Kajiyama |
| 2005/0230356 A1 | 10/2005 | Empedocles et al. |
| 2005/0282318 A1 | 12/2005 | Dao |
| 2005/0282356 A1 | 12/2005 | Lee |
| 2006/0034116 A1 | 2/2006 | Lam et al. |
| 2006/0071074 A1 | 4/2006 | Konececki et al. |
| 2006/0082004 A1* | 4/2006 | Parekh et al. ................. 257/798 |
| 2006/0099776 A1 | 5/2006 | Dupont |
| 2006/0124974 A1 | 6/2006 | Cabral et al. |
| 2006/0125011 A1 | 6/2006 | Chang |
| 2006/0197115 A1 | 9/2006 | Toda |
| 2006/0220134 A1 | 10/2006 | Huo et al. |
| 2006/0227601 A1 | 10/2006 | Bhattacharyya |
| 2006/0249770 A1 | 11/2006 | Huo et al. |
| 2007/0012945 A1 | 1/2007 | Sugizaki et al. |
| 2007/0018166 A1 | 1/2007 | Atanackovic et al. |
| 2007/0018223 A1 | 1/2007 | Abbott |
| 2007/0023805 A1 | 2/2007 | Wells et al. |
| 2007/0029607 A1 | 2/2007 | Kouznetsov |
| 2007/0045709 A1 | 3/2007 | Yang |
| 2007/0047364 A1 | 3/2007 | Chuang et al. |
| 2007/0057328 A1* | 3/2007 | Taniguchi et al. ............. 257/368 |
| 2007/0077694 A1 | 4/2007 | Lee |
| 2007/0080385 A1 | 4/2007 | Kim et al. |
| 2007/0127289 A1 | 6/2007 | Lee |
| 2007/0215954 A1 | 9/2007 | Mouli |
| 2007/0252175 A1 | 11/2007 | Tang et al. |
| 2007/0264771 A1 | 11/2007 | Ananthan et al. |
| 2008/0003774 A1 | 1/2008 | Baek |
| 2008/0124867 A1 | 5/2008 | Brown |
| 2008/0128802 A1 | 6/2008 | Huo et al. |
| 2008/0149984 A1 | 6/2008 | Chang et al. |
| 2008/0164528 A1 | 7/2008 | Cohen et al. |
| 2008/0211023 A1 | 9/2008 | Shino |
| 2008/0211061 A1 | 9/2008 | Atwater, Jr. et al. |
| 2008/0233694 A1 | 9/2008 | Li |
| 2008/0237776 A1 | 10/2008 | Abbott |
| 2008/0246023 A1 | 10/2008 | Zeng et al. |
| 2008/0299753 A1 | 12/2008 | Figura et al. |
| 2009/0003025 A1 | 1/2009 | Mokhlesi et al. |
| 2009/0010056 A1 | 1/2009 | Kuo et al. |
| 2009/0014813 A1 | 1/2009 | Chao et al. |
| 2009/0022003 A1 | 1/2009 | Song et al. |
| 2009/0026522 A1 | 1/2009 | Ananthan |
| 2009/0072341 A1 | 3/2009 | Liu et al. |
| 2009/0079030 A1 | 3/2009 | Cheng et al. |
| 2009/0108351 A1 | 4/2009 | Yang et al. |
| 2009/0129145 A1 | 5/2009 | Slesazeck et al. |
| 2009/0140290 A1 | 6/2009 | Schulze et al. |
| 2009/0170261 A1 | 7/2009 | Lee |
| 2009/0173984 A1 | 7/2009 | Wang |
| 2009/0189228 A1 | 7/2009 | Zhang et al. |
| 2009/0200536 A1 | 8/2009 | Van Schaijk et al. |
| 2009/0201723 A1 | 8/2009 | Okhonin et al. |
| 2009/0207681 A1 | 8/2009 | Juengling |
| 2009/0213648 A1 | 8/2009 | Siesazeck |
| 2009/0218656 A1 | 9/2009 | Gonzalez et al. |
| 2009/0242865 A1 | 10/2009 | Lung et al. |
| 2009/0246952 A1 | 10/2009 | Ishizaka et al. |
| 2009/0250738 A1 | 10/2009 | Dyer |
| 2009/0315084 A1 | 12/2009 | Cha et al. |
| 2010/0001271 A1 | 1/2010 | Mieno |
| 2010/0006938 A1 | 1/2010 | Jang |
| 2010/0008139 A1 | 1/2010 | Bae |
| 2010/0044670 A1 | 2/2010 | Ling |
| 2010/0061145 A1 | 3/2010 | Weis |
| 2010/0197141 A1 | 8/2010 | Tu et al. |
| 2010/0200916 A1 | 8/2010 | Gossner et al. |
| 2010/0203695 A1* | 8/2010 | Oh et al. ....................... 438/270 |
| 2010/0207180 A1 | 8/2010 | Lee |
| 2010/0248153 A1 | 9/2010 | Lee et al. |
| 2010/0277982 A1 | 11/2010 | Okhonin |
| 2011/0006377 A1 | 1/2011 | Lee et al. |
| 2011/0024791 A1 | 2/2011 | Schulze et al. |
| 2011/0156044 A1 | 6/2011 | Lee et al. |
| 2011/0163357 A1 | 7/2011 | Tan et al. |
| 2011/0215371 A1 | 9/2011 | Tang et al. |
| 2011/0215396 A1 | 9/2011 | Tang et al. |
| 2011/0215407 A1 | 9/2011 | Tang et al. |
| 2011/0215408 A1 | 9/2011 | Tang et al. |
| 2011/0215436 A1 | 9/2011 | Tang et al. |
| 2011/0223725 A1 | 9/2011 | Kang et al. |
| 2011/0223731 A1 | 9/2011 | Chung et al. |
| 2012/0205736 A1 | 8/2012 | Housley et al. |
| 2012/0223369 A1 | 9/2012 | Gupta et al. |
| 2012/0223380 A1 | 9/2012 | Lee et al. |
| 2014/0106554 A1 | 4/2014 | Pozzi et al. |

FOREIGN PATENT DOCUMENTS

| | | |
|---|---|---|
| CN | 201180011628.6 | 2/2015 |
| CN | 201180011589.X | 4/2015 |
| EP | 1918998 | 5/2008 |
| EP | 11751053 | 6/2014 |
| EP | 11751050 | 11/2014 |
| JP | H02-275663 | 11/1990 |
| JP | H04-64249 | 2/1992 |
| JP | H04-186815 | 7/1992 |
| JP | H04-283914 | 10/1992 |
| JP | 06-104446 | 4/1994 |
| JP | H08-088153 | 4/1996 |
| JP | H10-150176 | 6/1998 |
| JP | H11-103035 | 4/1999 |
| JP | 2000-150905 | 5/2000 |
| JP | 2003-030980 | 1/2003 |
| JP | 2004-03398 | 10/2004 |
| JP | 2005-136191 | 5/2005 |
| JP | 2005-327766 | 11/2005 |
| JP | 2007-511895 | 5/2007 |
| JP | 2008-010503 | 1/2008 |
| JP | 2009-531860 | 9/2009 |
| JP | 2011-508979 | 3/2011 |
| KR | 10-0663359 | 10/2006 |
| KR | 10-0702014 | 11/2006 |
| KR | 10-0821456 | 4/2008 |
| KR | 2009-0040460 | 4/2009 |
| KR | 2009-0054245 | 5/2009 |

(56) References Cited

FOREIGN PATENT DOCUMENTS

| TW | 200802866 | 1/2008 |
|---|---|---|
| TW | 101104088 | 12/2013 |
| TW | 100106777 | 2/2014 |
| TW | 100106775 | 6/2014 |
| TW | 100106776 | 11/2014 |
| WO | WO 2007/123609 | 11/2007 |
| WO | 2009/088889 | 7/2009 |
| WO | PCT/US2011/024354 | 9/2011 |
| WO | PCT/US2011/024376 | 9/2011 |
| WO | PCT/US2011/024387 | 9/2011 |
| WO | PCT/US2012/021438 | 8/2012 |
| WO | PCT/US2011/024354 | 9/2012 |
| WO | PCT/US2011/024376 | 9/2012 |
| WO | PCT/US2011/024387 | 9/2012 |
| WO | PCT/US2012/025109 | 9/2012 |
| WO | PCT/US2012/025115 | 10/2012 |
| WO | PCT/US2012/021438 | 8/2013 |
| WO | PCT/US2012/025109 | 9/2013 |
| WO | PCT/US2012/025115 | 9/2013 |

OTHER PUBLICATIONS

Bae, G.J. et al., "A Novel SiGe-Inserted SOI Structure for High Performance PDSOI CMOSFET", IEDM Tech. Digest, 2000, pp. 667-670.

Belford, et al., Performance-Augmented CMOS Using Back-End Uniaxial Strain, DRC Conf. Digest, 2002, pp. 41-42.

Bhattacharyya, A., "The Role of Microelectronic Integration in Environmental Control: A Perspective", Mat. Res. Soc. Symp. Proc. vol. 344, 1994, pp. 281-293.

Burke et al., "Silicon Carbide Thyristors for Power Applications", Pulsed Power Conference 1995, Digest of Technical Papers, 10th IEEE International vol. 1, United States, pp. 327-335.

Cheng, Z. et al., "SiGe-on-Insulator (SGOI): Substrate Preparation and MOSFET Fabrication for Electron Mobility Evaluation" and conference outline, MIT Microsystems, Tech. Labs, Cambridge, MA, 2001 IEEE Internatl. SOI Conf., Oct. 2001, pp. 13-14, 3-pg. outline.

Cheong et al., "Investigation of Ultralow Leakage in MOS Capacitors on 4H SiC", IEEE Transactions on Electron Devices, vol. 51(9), Sep. 2004, pp. 1361-1365.

Current, M.I. et al., "Atomic-Layer Cleaving with $Si_xGe_y$ Strain Layers for Fabrication of Si and Ge-Rich SOI Device Layers", 2001 IEEE Internatl. SOI Conf. Oct. 2001, pp. 11-12.

Dimitraiadis et al., "New a-SiC, Optically Controlled, Thyristor-Like Switch", Electronics Letters, vol. 28)17), Aug. 13, 1992, pp. 1622-1624.

Ernst, T. et al., "Fabrication of a Novel Strained SiGe:C-channel Planar 55 nm nMOSFET for High-Performance CMOS", 2002 Sympos. on VLSI Tech. Digest of Technical Papers, pp. 92-93.

Feder, B.J., "I.B.M. Finds Way to Speed Up Chips", The New York Times, Jun. 8, 2001, reprinted from http://www.nytimes.com/2001/06/08 /technology/08BLUE.html, 2 pgs.

Garone, P.M. et al., "Mobility Enhancement and Quantum Mechanical Modeling in $Ge_xSi_{1-x}$ Channel MOSFETs from 90 to 300K", IEDM Tech. Digest, 1991, pp. 29-32.

Gu, J. et al., "High Performance Sub-100 nm Si Thin-Film Transistors by Pattern-Controlled Crystallization of Thin Channel Layer and High Temperature Annealing", DRC Conf. Digest 2002, pp. 49-50.

Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209-212.

Hara, A. et al., "High Performance Poly-Si TFTs on a Glass by a Stable Scanning CW Laser Lateral Crystallization", IEDM Tech. Digest, 2001, pp. 747-750.

Huang, L.J. et al., "Carrier Mobility Enhancement in Strained Si-on-Insulator Fabricated by Wafer Bonding", 2001 Sympos. on VLSI Tech. Digest of Technical Papers, pp. 57-58.

Jagar, S. et al., "Single Grain Thin-Fim-Transistor (TFT) with SOI CMOS Performance Formed by Metal-Induced-Lateral-Crystallization", IEDM Tech. Digest, 1999, p. 293-296.

Jen et al., "Electrical and Luminescent Characteristics of a-SiC:H P-I-:" Thin-Film LED's with Graded-Gap Junctions", IEEE Transactions on Electron Devices, vol. 44(4), Apr. 1997, pp. 565-571.

Jeon, J. et al., "A New Poly-Si TFT with Selectively Doped Channel Fabricated by Novel Excimer Laser Annealing", IEDM Tech. Digest, 2000, pp. 213-216.

Kesan, V. et al., "High Performance 0.25 µm p-MOSFETs with Silicon-Germanium Channels for 300K and 77K Operation", IEDM Tech. Digest, 1991, pp. 25-28.

Kim, C.H. et al., "A New High-Performance Poly-Si TFT by Simple Excimer Laser Annealing on Selectively Floating a-Si Layer", IEDM Tech. Digest, 2001, pp. 751-754.

King, T. et al, "A Low-Temperature (?550° C.) Silicon—Germanium MOS Thin-Film Transistor Technology for Large-Area Electronics", IEDM Tech. Digest, 1991, pp. 567-570.

Kuriyama, H. et al., "High Mobility Poly-Si TFT by a New Excimer Laser Annealing Method for Large Area Electronics", IEDM Tech. Digest, 1991, pp. 563-566.

Li, P. et al., "Design of High Speed Si/SiGe Heterojunction Complementary MOSFETs with Reduced Short-Channel Effects", Natl. Central University, ChungLi, Taiwan, ROC, Aug. 2001, Contract No. NSC 89-2215-E-008-049, Natl. Science Council of Taiwan., pp. 1, 9.

Lu, N.C.C. et al., "A Buried-Trench DRAM Cell Using a Self-Aligned Epitaxy Over Trench Technology", IEDM Tech. Digest, 1988, pp. 588-591.

Markoff, J., "I.B.M. Circuits are Now Faster and Reduce Use of Power", The New York Times, Feb. 25, 2002, reprinted Mar. 20, 2002, from http://story.news.yahoo.com/ news?tmpl=story&u=/nyt/20020225/ . . . , 1 pg.

Mizuno, T. et al., "High Performance CMOS Operation of Strained-SOI MOSFETs Using Thin Film SiGe-on-Insulator Substrate", 2002 Sympos. on VLSI Tech. Digest of Technical Papers, p. 106-107.

Myers, S.M. et al., "Deuterium Interactions in Oxygen-Implanted Copper", J. Appl. Phys., vol. 65(1),. Jan. 1, 1989, p. 311-321.

Nayfeh, H.M. et al., "Electron Inversion Layer Mobility in Strained-Si n-MOSFET's with High Channel Doping Concentration Achieved by Ion Implantation", DRC Conf. Digest, 2002, pp. 43-44.

Ono, K. et al., "Analysis of Current-Voltage Characteristics in Polysilicon TFTs for LCDs", IEDM Tech. Digest, 1988, pp. 256-259.

Park, et al., "Normal Incident SiGe/Si Multiple Quantum Well Infrared Detector", IEDM Tech. Digest, 1991, pp. 749-752.

Powell et al., "SiC Materials—Progress, Status, and Potential Roadblocks", Proceedings of the IEEE, vol. 90(6), Jun. 2002, pp. 942-955.

Rim, K. et al., "Characteristics and Device Design of Sub-100 nm Strained SiN- and PMOSFETs", 2002 Sympos. on VLSI Tech. Digest of Technical Papers, pp. 98-99.

Rim, K. et al., "Strained Si NMOSFET's for High Performance CMOS Technology", 2001 Sympos. on VLSI Tech. Digest of Technical Papers, p. 59-60.

Saggio, M. et al., "Innovative Localized Lifetime Control in High-Speed IGBT's", IEEE Elec. Dev. Lett., V. 18, No. 7, Jul. 1997, pp. 333-335.

Shima, M. et al., "<100> Channel Strained-SiGe p-MOSFET with Enhanced Hole Mobility and Lower Parasitic Resistance", 2002 Sympos. on—VLSI Tech. Digest of Technical Papers, pp. 94-95.

Takagi, Strained-Si- and SiGe-on-Insulator (Strained SOI and SGOT) MOSFETs for High Performance/Low Power CMOS Application, DRC Conf. Digest, 2002, pp. 37-40.

Tezuka, T. et al., "High-Performance Strained Si-on-Insulator MOSFETs by Novel Fabrication Processes Utilizing Ge-Condensation Technique", 2002 VLSI Tech. Digest of Technical Papers, pp. 96-97.

Tzeng et al., "Dry Etching of Silicon Materials in SF6 Based Plasmas", J. Electrochem. Soc., 1987 vol. 134, issue 9, pp. 2304-2309.

van Meer, H. et al., "Ultra-Thin Film Fully-Depleted SOI CMOS with Raised G/S/D Device Architecture for Sub-100 nm Applications", 2001 IEEE Internatl. SOI Conf. Oct. 2001, pp. 45-46.

Xie et al., "A Veritically Integrated Bipolar Storage Cell in 6H Silicon Carbide for Nonvolatile Memory Applications", IEEE Electron Device Letters, vol. 15(6), Jun. 1994, pp. 212-214.

(56) References Cited

OTHER PUBLICATIONS

Yamada, T. et al., "Spread Source/Drain (SSD) MOSFET Using Selective Silicon Growth for 64Mbit DRAMs", IEDM Tech. Digest, 1989, pp. 35-38.

Yamauchi, N. et al., "Drastically Improved Performance in Poly-Si TFTs with Channel Dimensions Comparable to Grain Size", IEDM Tech. Digest, 1989, pp. 353-356.

U.S. Appl. No. 14/265,168, filed Apr. 29, 2014, Righetti et al.

U.S. Appl. No. 14/461,689, filed Aug. 18, 2014, Mariani et al.

U.S. Appl. No. 14/461,730, filed Aug. 18, 2014, Zanderigo et al.

U.S. Appl. No. 14/461,751, filed Aug. 18, 2014, Mariani et al.

Cho et al., A Novel Capacitor-Less DRAM Cell Using Thin Capacitively-Coupled Thyristor (TCCT), IEEE, 2005, 4 pages.

Nemati et al., A Novel High Density, Low Voltage SRAM Cell with a Vertical NDR Device, IEEE, 1998, 2 pages.

Sasago et al., "Cross-point phase change memory with 4F2 cell size driven by low-contact-resistivity poly-Si diode", Symposium on VLSI Technology Digest of Technical Papers, 2009, pp. 24-25.

Sugizaki et al., "35-nm Gate-Length and Ultra Low-voltage (0.45 V) Operation Bulk Thyristor-SRAM/DRAM (BT-RAM) Cell with Triple Selective Epitaxy Layers (TELs)", Symposium on VLSI Technology Digest of Technical Papers, 2008.

Suliman et al., Gate-Oxide Grown on the Sidewalls and Base of a U-Shaped Si Trench: Effects of the Oxide and Oxide/Si Interface Condition on the Properties of Vertical MOS Devices, Microelectronic Engineering, vol. 72, pp. 247-252; 2004.

Yang et al., High Performance CMOS Fabricated on Hybrid Substrate with Different Crystal Orientations, IEEE, 2003, 4 pages.

Yu et al., Low-Temperature Titanium-Based Wafer Bonding, Journal of the Electrocheical Society, vol. 154, No. 1, 2007, pp. H20-H25.

\* cited by examiner

CIRCUIT STRUCTURES, MEMORY CIRCUITRY, AND METHODS

RELATED PATENT DATA

This application is a divisional of U.S. patent application Ser. No. 13/191,293, which was filed on Jul. 26, 2011, entitled Circuit Structures, Memory Circuitry, And Methods, listing John K. Zahurak, Sanh D. Tang, Lars P. Heineck, Martin C. Roberts, and Wolfgang Mueller as inventions, and which is incorporated herein by reference.

TECHNICAL FIELD

Embodiments disclosed herein pertain to circuit structures, to memory circuitry, and to methods of making circuitry structures and memory circuitry.

BACKGROUND

A continuing trend in the electronics industry is the miniaturization of electronic devices. This is especially true for electronic devices operated through the use of semiconductor microchips. Microchips are commonly viewed as the brains of most electronic devices. In general, a microchip comprises a small substrate upon which are built millions or billions of nanoscopic electronic devices that are integrally configured to form electronic circuits. The circuits are interconnected in a unique way to perform a desired function.

Electronic devices may be formed side-by-side in a single plane on a common substrate, such as a silicon-comprising substrate. Some side-by-side devices are formed relative to semiconductor-on-insulator substrates, and can be subject to a phenomenon known as "floating body effect". Regardless, side-by-side positioning uses a relatively large amount of surface area, or "real estate," on the substrate. As a result, devices alternately or additionally may be formed vertically in an effort to use less horizontal substrate area.

DETAILED DESCRIPTION OF EXAMPLE EMBODIMENTS

Figure 1:
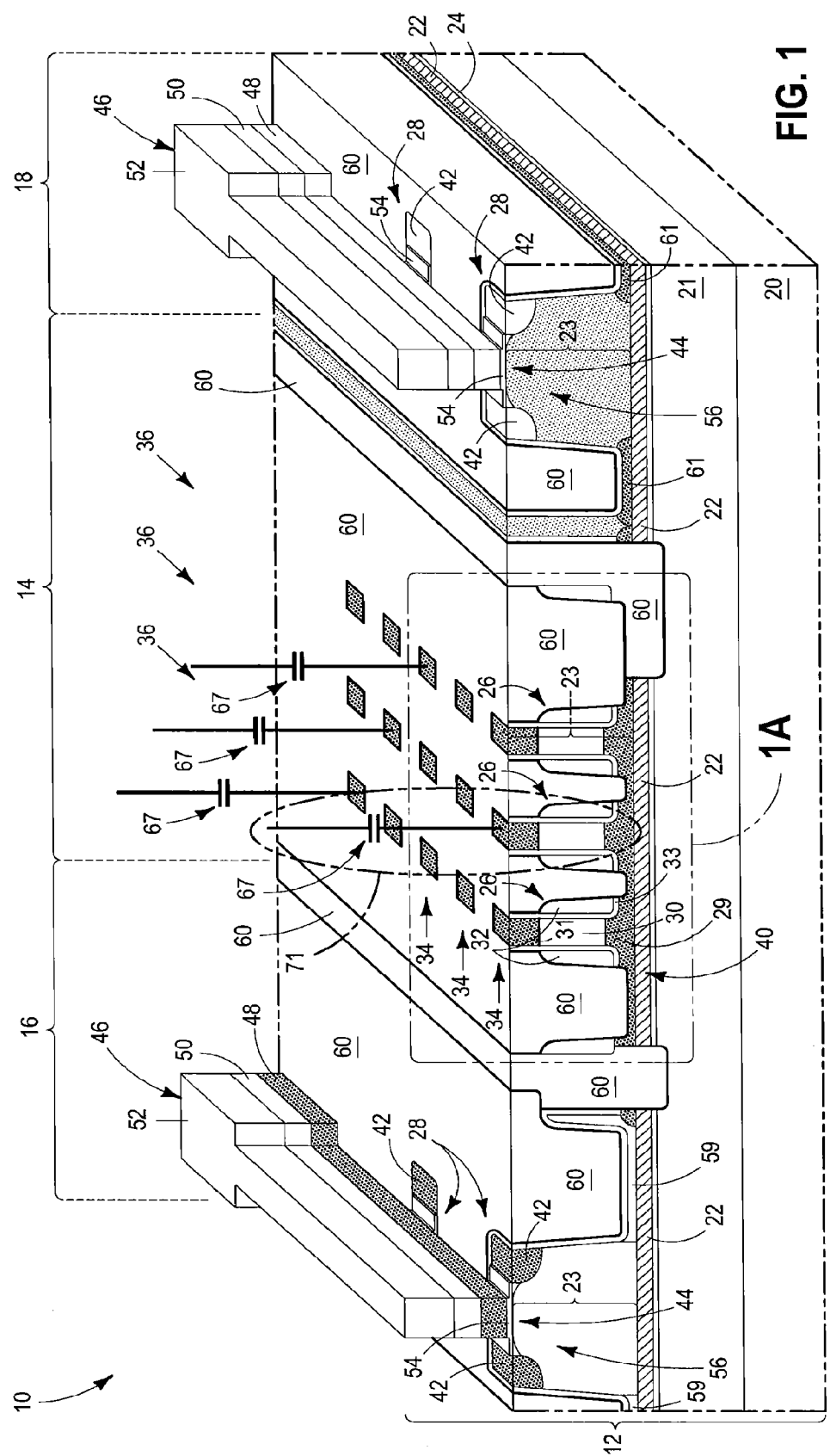
FIG. 1 is a diagrammatic oblique projection and partial schematic view of part of a circuit structure in accordance with an embodiment of the invention, with some operative components having been removed for clarity.
Figure 1A:
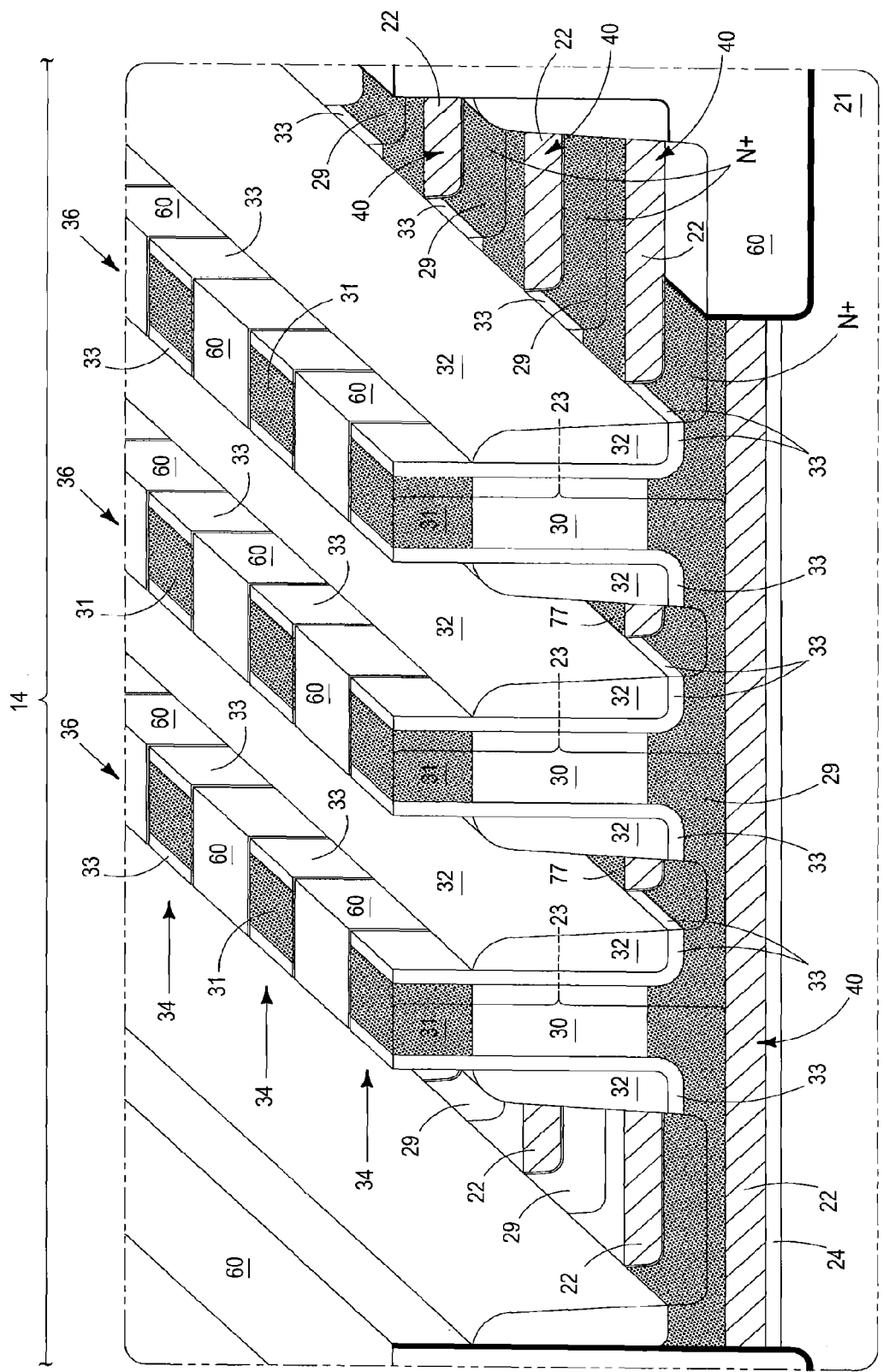
FIG. 1A is an enlargement of a portion of FIG. 1.

Some embodiments of the invention include circuit structures. In some embodiments, the circuit structure comprises memory circuitry. An example embodiment circuit structure is described initially with reference to FIGS. 1, 1A, 2 and 3. FIG. 1 is the same as FIG. 2, but wherein some operative circuit components in FIG. 2 have not been shown in FIG. 1 solely for clarity in FIG. 1. FIG. 1A is an enlargement of a portion of FIG. 1, yet also with some of the dielectric material in FIG. 1 having been removed for clarity in seeing certain operative components in FIG. 1A.

Referring to FIGS. 1 and 1A, a circuit structure 10 includes a substrate 12 comprising an array region 14 and a peripheral region 16, 18. Two peripheral regions 16 and 18 are shown on laterally opposing sides of array region 14, and may be collectively considered as a peripheral region. There may be more or fewer than two peripheral regions relative to array region 14, and the peripheral region(s) may be of any shape, position, or configuration. In one embodiment, one of two peripheral regions will be used primarily for fabrication of p-type circuitry (e.g., PMOS) and another of two peripheral regions will be used primarily for fabrication of n-type circuitry (e.g., NMOS). In one embodiment, array region 14 comprises a memory array which includes a plurality of memory cells. Logic circuitry may be fabricated outside of array region 14. Control and/or other peripheral circuitry for operating a memory array may or may not be fully or partially within array region 14, with an example memory array region 14 as a minimum encompassing all of the memory cells of a given memory array/sub-memory array. Further, multiple sub-arrays might also be fabricated and operated independently, in tandem, or otherwise relative one another. As used herein, a "sub-array" or "sub-memory array" may be considered as an array.

Substrate 12 in array region 14 and peripheral region 16, 18 comprises a semiconductor-metal-on-insulator (SMOI) structure. Such structure includes, in one embodiment, a first semiconductor material 20, an insulator material 21 (i.e., dielectric) over first semiconductor material 20, conductive material 22 over insulator material 21, and second semiconductor material 23 over conductive material 22. Each of materials 20, 21, 22 and 23 may be homogenous or non-homogenous. In one embodiment, second semiconductor material 23 comprises regions of different conductivity type (i.e., p and n) in each of array region 14 and peripheral region 16, 18. First semiconductor material 20 and second semiconductor material 23 may be of the same composition or of different compositions relative one another independent of or apart from conductivity modifying impurity that may be provided in each. Example semiconductor materials include silicon, silicon-germanium, gallium arsenide, gallium nitride, indium phosphide, etc. Example insulator materials 21 include silicon dioxide, borophosphosilicate glass (BPSG), borosilicate glass (BSG), phosphosilicate glass (PSG), and/or silicon nitride.

Conductive material 22 is current conductive, may be a phase change material, and may comprise metal whether in elemental, alloy, and/or compound forms. Examples include titanium, titanium silicide, titanium oxide, titanium nitride, tantalum, tantalum silicide, tantalum oxide, tantalum nitride, tungsten, tungsten silicide, tungsten oxide, tungsten nitride, other metal, other metal silicides, other metal oxides, or other metal nitride materials, including combinations thereof. In one embodiment, conductive material 22 may comprise titanium nitride including, for example, a titanium-rich titanium nitride such as metal mode titanium nitride (MMTiN).

In one embodiment, an amorphous material 24 is provided between insulator material 21 and conductive material 22 in array region 14 and peripheral region 16, 18. Amorphous material 24 may be semiconductive, with example materials including silicon and/or gallium. Amorphous material 24 may be provided to facilitate fabrication of substrate 12 where, for example, such is formed initially by combination of a donor wafer and an acceptor wafer, and regardless may or may not have an attribute associated with the functioning of the resultant circuitry.

An example thickness range for insulator material 21 is from about 5 to 200 nanometers, for amorphous material 24 from about 10 to 40 nanometers, for conductor material 22 from about 30 to 50 nanometers (e.g., from about 3 to 5 nanometers of titanium over about 20 to 40 nanometers of titanium nitride), and for second semiconductor material 23 from about 175 to 200 nanometers.

Array region 14 comprises vertical circuit devices 26 which comprise second semiconductor material 23. Peripheral region 16, 18 comprises horizontal (e.g., planar) circuit devices 28 which comprises second semiconductor material 23. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three dimensional space. Further, words such as "under", "outwardly", and "beneath" are relative terms corresponding to the vertical direction with respect to the structure being described. Vertical and horizontal as used herein for a device are with respect to direction of predominant current flow through such device. Not all vertical circuit devices 26 need be of the same construction, and array region 14 may additionally include non-vertical circuit devices. Likewise, not all horizontal devices 28 need be of the same construction, and peripheral region 16, 18 may additionally include non-horizontal circuit devices. Regardless, array region 14 may be characterized by a physical arrangement or ordering of a plurality of operative components, and that in one embodiment may be in rows and columns and in one embodiment may be of like-construction. By way of example, vertical circuit devices 26 are shown as being arrayed within array region 14 in rows 34 and columns 36. Only some of such rows and columns are shown for clarity in the drawings with perhaps thousands or more such rows and columns being provided within an array. Further, devices 26, 28 are shown only diagrammatically for clarity, and the devices may be positioned much closer together within the respective regions.

In one embodiment and as shown, vertical circuit devices 26 comprise transistors. Alternate or additional example vertical circuit devices will be described below. Vertical transistors 26 individually comprise a bottom source/drain region 29, a top source/drain region 31, and a channel region 30 between the top and bottom source/drain regions, with each of these regions comprising second semiconductor material 23. A gate 32 is provided operatively laterally proximate channel region 30. Gate dielectric 33 is between gate 32 and channel region 30. The example embodiment depicts dual-gated channel regions 30 having two gate portions 32 formed on opposing lateral sides of each channel region 30. Gates 32 may comprise any suitable conductive material and may longitudinally extend as lines in column direction 36. Conductive material 22 in array region 14 may be in the form of conductive straps 40 that are under and electrically coupled to a plurality of vertical circuit devices 26. In one embodiment, individual conductive straps 40 are electrically coupled to or with bottom source/drain regions 29 of vertical transistors 26 within an individual row 34.

Horizontal circuit devices 28 within peripheral region 16, 18 may comprise transistors. For example, second semiconductor material 23 of individual horizontal circuit devices 28 comprises a pair of source/drain regions 42 having a channel region 44 there-between. An example gate line construction 46 is over channel regions 44, and may comprise a conductively doped semiconductor region 48 (e.g., conductively doped polysilicon), a higher conductivity metal region 50 thereover (e.g., one or both of an elemental metal and metal silicide), and a dielectric cap 52. A gate dielectric 54 is between conductive material 48 and channel region 44. Channel region 44 comprises part of a floating body 56 within second semiconductor material 23. Conductive material 22 is under and electrically coupled to second semiconductor material 23 of floating bodies 56. In one embodiment and as shown, conductive material 22 in peripheral region 16, 18 is under all of floating bodies 56 within a blanket area of the peripheral region (e.g., either of blanket areas 16 or 18) and is continuously connected there-within. In operation, suitable potential(s) provided to conductive material 22 in peripheral region(s) 16, 18 may be used to reduce or to control floating body effect with respect to horizontal circuit devices 28.

Second semiconductor material 23 in peripheral region 16, 18 may comprise an NMOS region and a PMOS region. As an example, region 16 may be NMOS and region 18 may be PMOS. For example within NMOS region 16, source/drain regions 42 may be heavily doped n-type, semiconductor material 48 of gate line 46 may be heavily doped n-type, and floating body region 56 (and channel region 44) may be lightly doped p-type. In the figures, n-type is indicated with stippling, with the denser stippling indicating heavy doping and the less dense stippling indicating lighter doping. In one embodiment, p-type material within NMOS region 16 is directly against conductive material 22. In this document, a material or structure is "directly against" another when there is at least some physical touching contact of the stated materials or structures relative one another. In contrast, "over" encompasses "directly against" as well as construction where intervening material(s) or structure(s) result(s) in no physical touching contact of the stated materials or structures relative one another. In one embodiment, second semiconductor material 23 within NMOS region 16 may additionally include highly doped p-type regions 59 directly against conductive material 22 for better electrical coupling therewith.

Within PMOS region 18, source/drain regions 42 may be heavily doped p-type (i.e., to a concentration of at least about $1 \times 10^{20}$ atoms/cm$^3$), semiconductor material 48 of gate line 46 may be heavily doped p-type, and channel region 44 may be lightly doped n-type (i.e., to a concentration no greater than about $1 \times 10^{19}$ atoms/cm$^3$). In one embodiment and as shown, PMOS region 18 comprises n-type material directly against conductive material 22. In one embodiment, second semiconductor material 23 within PMOS region 18 may include highly doped n-type regions 61 directly against conductive material 22.

Dielectric material 60 is provided as isolation between certain immediately adjacent device components within array region 14 and between certain immediately adjacent device components within peripheral region 16, 18. Dielectric material 60 may be homogenous or non-homogenous, with doped and undoped silicon dioxide and silicon nitride being examples. Dielectric material 60 may be over conductive material 22 and lateral of second semiconductor material 23 within array region 14 and peripheral region 16, 18. The same or different composition dielectric material would be received atop substrate 12, but is not shown in the figures for clarity with respect to other components.

Figure 2:
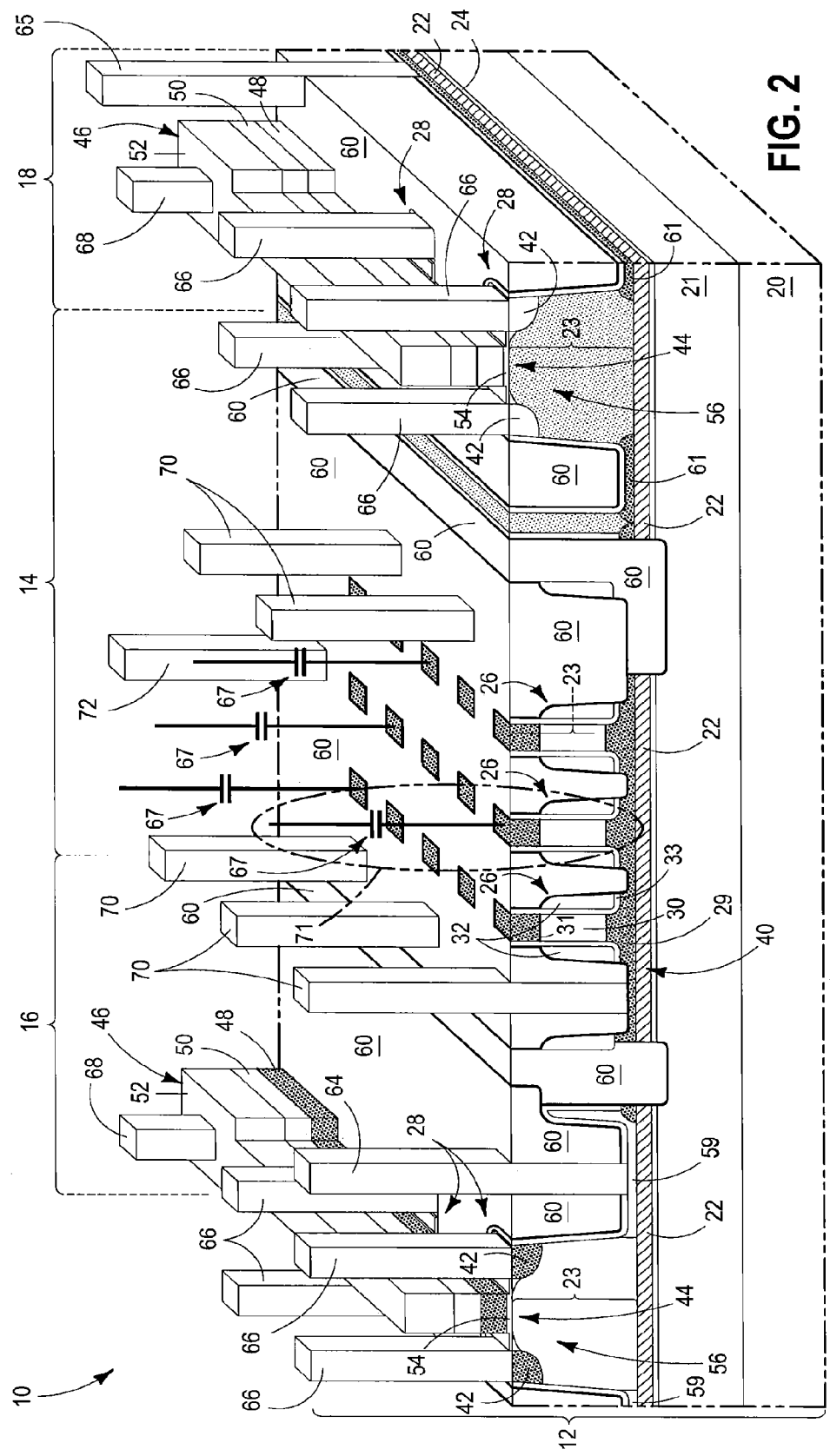
FIG. 2 is another view of the FIG. 1 circuit structure showing additional operative components

A conductive contact is provided within the peripheral region which extends to the conductive material through dielectric material that is over the conductive material and lateral of the second semiconductive material. Conductive contacts are shown in FIG. 2 but not in FIGS. 1 and 1A for better clarity in FIG. 1 with respect to circuit components other than the contacts. FIG. 2 depicts a peripheral region conductive contact 64 which extends to conductive material 22 within NMOS region 16. A peripheral region conductive contact 65 extends to conductive material 22 within PMOS region 18. Additional peripheral region conductive contacts 66 extend to source/drain regions 42 in NMOS region 16 and PMOS region 18. Further, peripheral region conductive contacts 68 extend through dielectric caps 52 to conductive material 50 of gate line constructions 46. Array region 14 includes conductive contacts 70 which extend to individual conductive straps 40. Array region 14 also includes conductive contacts 72 (only one being shown in FIG. 2) which respectively extend to an end of a pair of gate lines 32 which straddle channel regions 30 along individual columns 36 (FIGS. 1, 1A).

Figure 4:
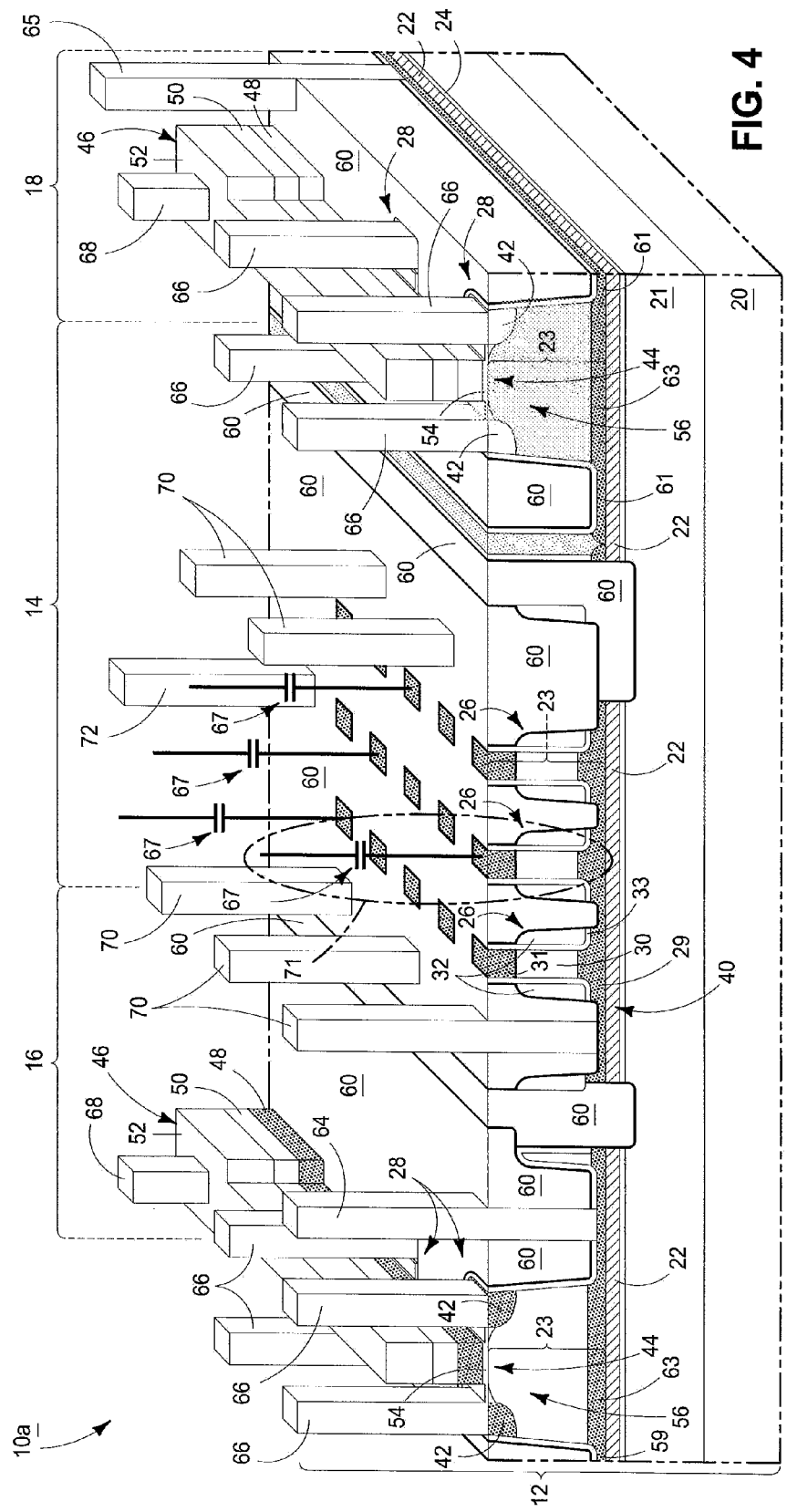
FIG. 4 is a diagrammatic oblique projection and partial schematic view of part of a circuit structure in accordance with an embodiment of the invention.

An alternate embodiment circuit structure 10a is shown in FIG. 4. Like numerals from the FIG. 2 embodiment are used where appropriate, with some construction differences being indicated with the suffix "a" or with different numerals. In one embodiment, an NMOS region has n-type material of the second semiconductor material between the conductive material and the p-type material, and in one embodiment also directly against the conductive material. In FIG. 4, second semiconductor material 23 in NMOS region 16 includes n-type material 63 directly against conductive material 22. In contrast in the example FIGS. 1 and 2 embodiment, an NMOS region 16 has p-type material of second semiconductor material 23 directly against conductive material 22.

Some embodiments of the invention comprise memory circuitry. In one example and with reference to FIGS. 1-4, a substrate has a memory array region 14 and a peripheral region (e.g., either of region 16 or 18 taken alone or in combination). The memory circuitry includes horizontal transistors 28 in peripheral region(s) 16, 18 which individually comprise a floating body 56 comprising second semiconductor material 23. Conductive material 22 in peripheral region(s) 16, 18 is under and electrically couples to second semiconductor material 23 of floating bodies 56. Conductive material 22 in memory array region 14 may comprise individual digit lines (e.g., individual lines 40) under and electrically coupled to bottom source/drain regions 29 of rows 34 of vertical transistors 26 in memory array region 14.

Word lines, for example conductive lines 32, are operatively received laterally adjacent channel regions 30 along columns 36 of vertical transistors 26 in memory array region 14. Charge storage devices are provided which individually electrically couple to respective of the top source/drain regions 31. Any suitable charge storage device may be used, with some capacitors 67 being shown schematically as an example in FIG. 1. Array region 14 includes a plurality of memory cells, with one such memory cell being designated in FIGS. 1, 2, and 4 with a circle 71.

Figure 3:
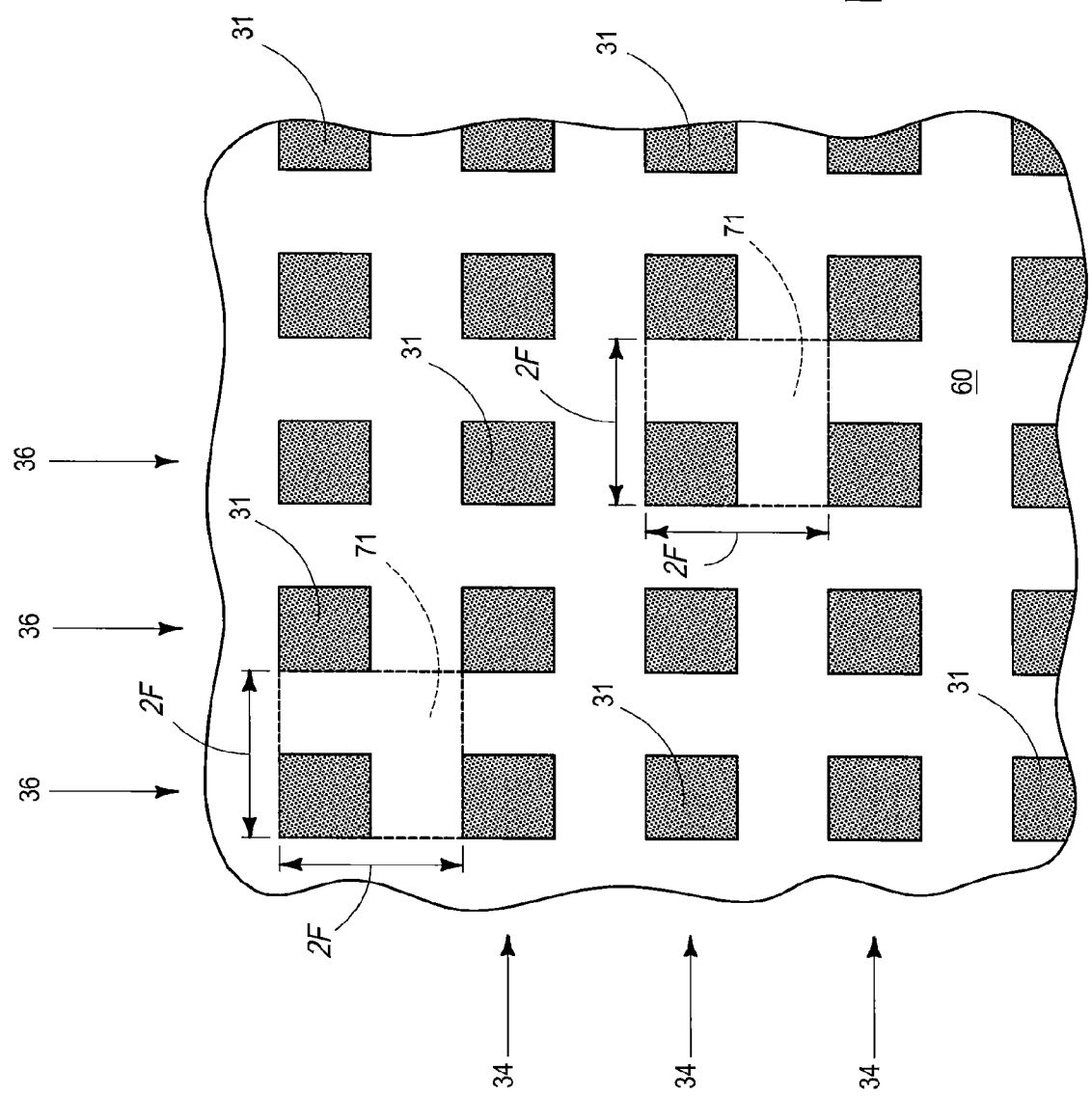
FIG. 3 is a diagrammatic partial top plan view of a portion of a FIG. 1-like circuit structure.

In one embodiment, individual memory cells of an array occupy about 4 $F^2$ of horizontal area, where "F" is the minimum lateral feature dimension of the smallest feature that is formed using feature edges of a mask pattern that is received outwardly of material from which such smallest features are formed. For example, FIG. 3 is a diagrammatic top plan view showing individual memory cells 71 received within 2 F by 2 F squares.

In one embodiment, memory circuitry comprises a substrate having a memory array region and a peripheral region. The substrate in the peripheral and memory array regions comprises insulator material over first semiconductor material, conductive material over the insulator material, and second semiconductor material over the conductive material. The memory array region comprises a plurality of memory cells individually comprising a vertically oriented circuit device which comprises the second semiconductor material. Memory cells 71 in FIG. 1 are but one example such memory cell. However, any memory cell construction may be employed which has at least two electrodes encompassed by or constituting at least a portion of a vertically oriented circuit device (not necessarily a transistor). Such memory cells may be volatile or nonvolatile, and regardless may be capable of random access. By ways of example only, examples include resistive, conductive bridging, phase change, floating body, and/or thyristor based random access memories which may be vertically oriented and thereby constitute a vertical circuit device. Regardless, in such memory circuitry, horizontal circuit devices are included in the peripheral region, and which individually comprise a floating body comprising the second semiconductor material. The conductive material in the peripheral region is under and electrically coupled to the second semiconductor material of the floating bodies. The conductive material in the memory array region includes individual access lines under and electrically coupled to rows of the vertically oriented circuit devices of the memory cells in the memory array region.

Any of the above constructions may be fabricated in accordance with any existing or yet-to-be-developed technique(s). An example manner of fabricating the circuit structure of FIGS. 1, 1A, and 2 is next described with reference to FIGS. 5-11 and FIG. 2. Nevertheless, structural aspects of the invention are not limited by the method of manufacture, nor are the claimed methods limited by structure unless language literally appears in the claim under analysis. Like numerals from the above-described embodiments have been used where appropriate. Further, many of the numerals are used to designate the materials from which the components of FIGS. 1, 1A, and 2 are fabricated prior to them necessarily being of the final example shapes for clarity in the drawings and ease of understanding in the description.

Figure 5:
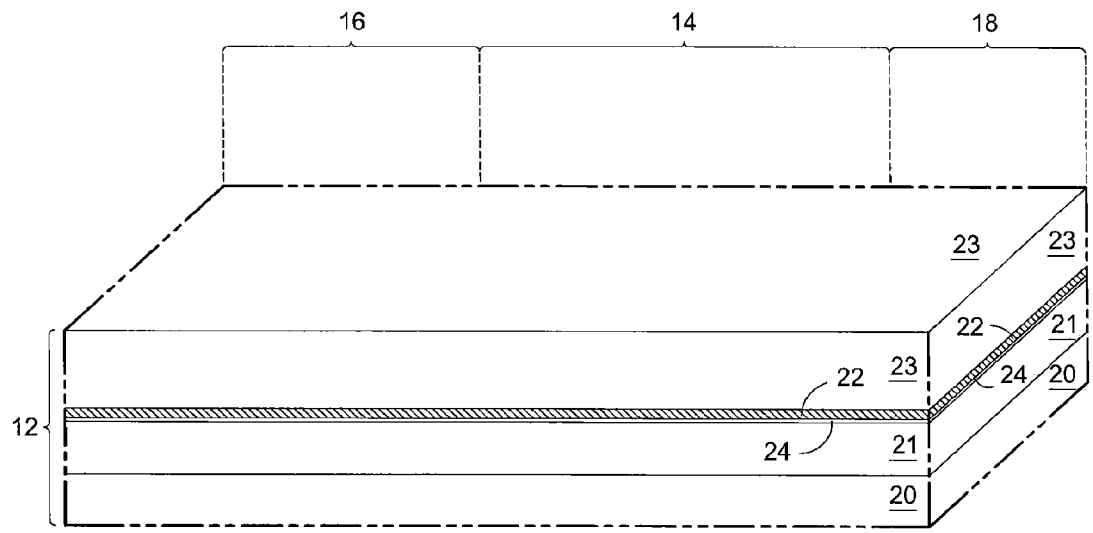
FIG. 5 is a diagrammatic oblique projection view of part of a substrate in process in accordance with an embodiment of the invention.

Referring to FIG. 5, a substrate 12 in process has been formed to constitute a semiconductor-metal-on-insulator substrate having semiconductor material 20, insulator material 21, conductive material 22, and second semiconductor material 23 extending from an array region 14 to a peripheral region (i.e., into either of peripheral regions 16 and 18 considered separately or in combination). In one embodiment, semiconductor materials 20, 23 and conductive material 22 of a semiconductor-metal-on-insulator substrate are formed at the same levels and at the same time within a peripheral region 16 and/or 18 and within an array region 14. In one embodiment, amorphous material 24 is between conductive material 22 and insulator 21. Substrate 12 may be formed by any suitable methods which are not particular material to this disclosure. Yet as an example, an acceptor wafer comprising materials 20 and 21 may be bonded with a donor wafer comprising materials 22, 23, and 24. Amorphous material 24 may function as an adhesion material during bonding of the donor and acceptor wafers, and the donor wafer may include an outer cleave portion formed by implanting an atomic species (e.g., hydrogen) into the substrate. Bonding may occur by application of heat, for example heating one or both wafers to a temperature of from about 300° C. to about 400° C. Smart-Cut® or other technology may be used. Example techniques are as described in our U.S. patent application Ser. No. 12/715,704, filed Mar. 2, 2010, entitled "Semiconductor-Metal-On-Insulator Structures, Methods of Forming Such Structures, and Semiconductor Devices Including Such Structures".

Figure 6:
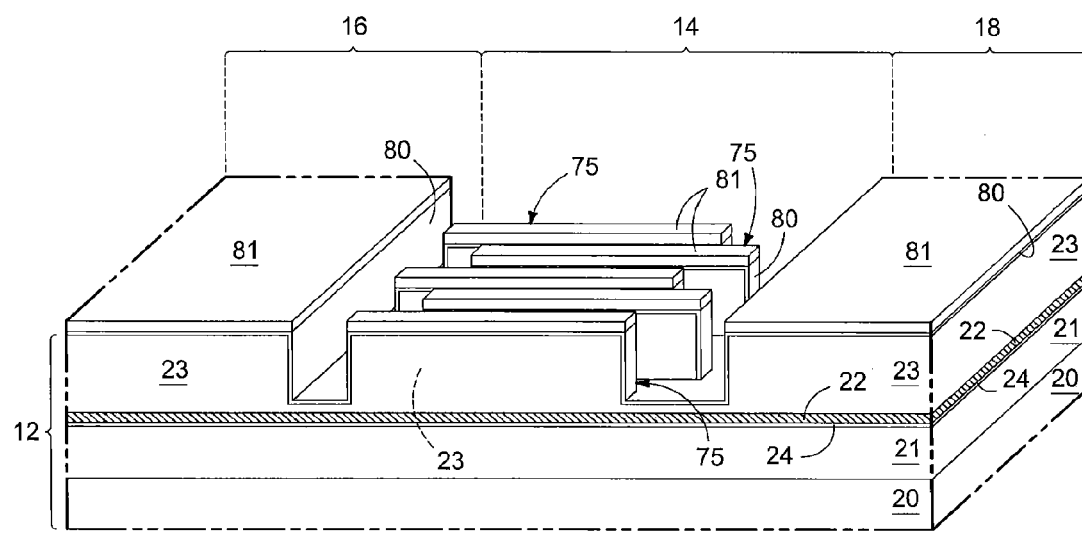
FIG. 6 is a view of the FIG. 5 substrate at a processing step subsequent to that shown by FIG. 5.

Referring to FIG. 6, substrate 12 has been processed whereby array region 14 includes outlines 75 for the conductive straps/lines 40 (not shown) that are to be formed which will comprise conductive material 22. Outlines 75 may be formed using pitch multiplication techniques. Regardless, second semiconductor material 23 has been etched through within array region 14 to leave some of second semiconductor material 23 (e.g., from about 40 to 50 nanometers) over conductive material 22. In one embodiment, a silicon dioxide material 80 (e.g., about 6 nanometers) has been formed over second semiconductor material 23, and hard masking material 81 (e.g., silicon nitride) has been formed thereover. Patterning may occur with formation of desired conductivity type and concentration within all or some of the array and/or peripheral regions before and/or after forming materials 80, 81.

Figure 7:
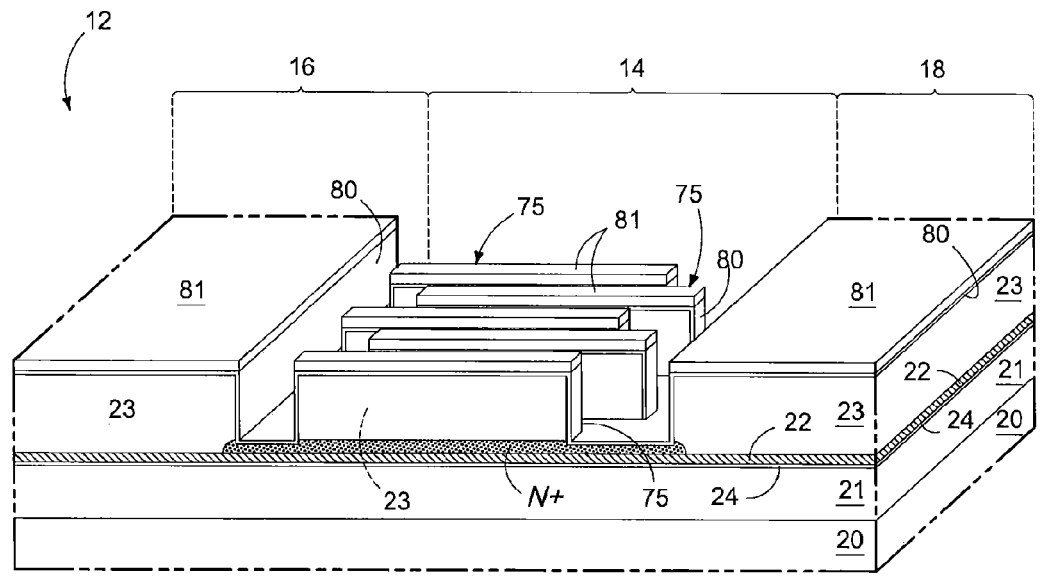
FIG. 7 is a view of the FIG. 6 substrate at a processing step subsequent to that shown by FIG. 6.

Referring to FIG. 7, ion implanting has been conducted to form a highly doped n-type region (shown as N+) from which source/drain regions 29 may be ultimately formed. An example implant species is arsenic implanted at an example energy of 7 KeV and dose of $1 \times 10^{15}$ atoms/cm$^2$. Where outlines 75 are sufficiently laterally thin, the n-type implanted material will sufficiently diffuse laterally to join beneath such outlines. Such diffusion may thereby form a blanketing N+ implanted region under and between outlines 75 within all of array region 14. Such diffusion may, for example, occur in conjunction with activating such implanted dopants, for example at a temperature of 955° C. for 20 seconds in an $N_2$ ambient.

Figure 8:
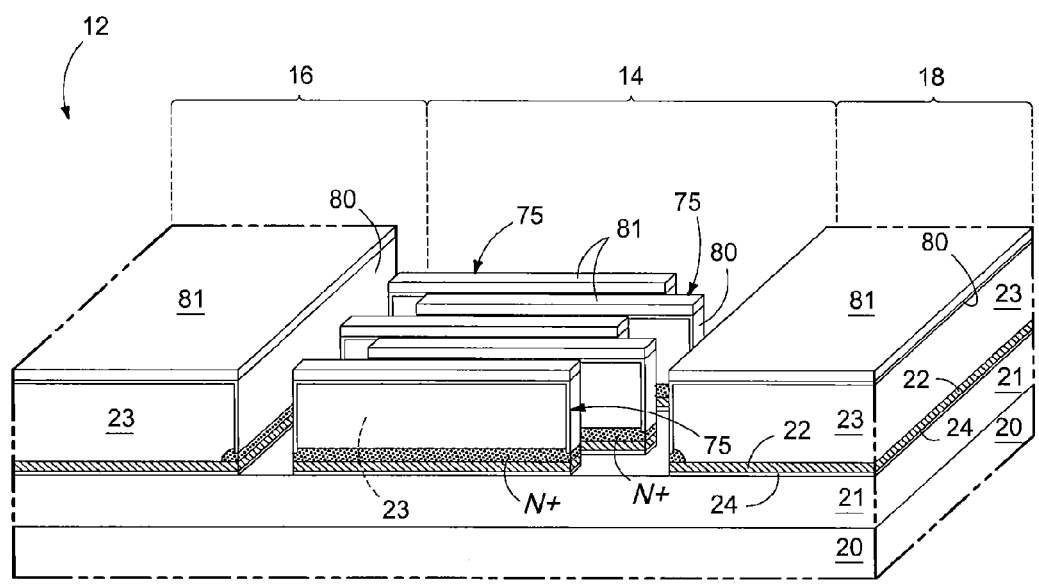
FIG. 8 is a view of the FIG. 7 substrate at a processing step subsequent to that shown by FIG. 7.

Referring to FIG. 8, masking material 81 has been used as a mask while etching remaining second semiconductor material 23 received between outlines 75 in array region 14, and to etch through conductive material 22 and amorphous material 24 to insulator material 21. The mask may also be used to separate conductive material 22 from being connected between peripheral region(s) 16, 18 and array region 14. Such provides but one example embodiment of subtractively patterning conductive material 22 within array region 14 and to separate such conductive material from being connected between peripheral region(s) 16, 18 and array region 14 at the same time. In one embodiment, such also comprises an example of subtractively patterning conductive material 22 within array region 14 and separating conductive material 22 from being connected between peripheral region(s) 16, 18 and array region 14 using a common masking step (e.g., that mask depicted as being formed in FIG. 7). One embodiment of the invention includes removing some of conductive material 22 within array region 14 while leaving at least some of conductive material 22 in peripheral region(s) 16, 18. FIG. 8 shows an act of removing some conductive material 22 that leaves at least a majority of conductive material 22 remaining in peripheral region(s) 16, 18.

Figure 9:
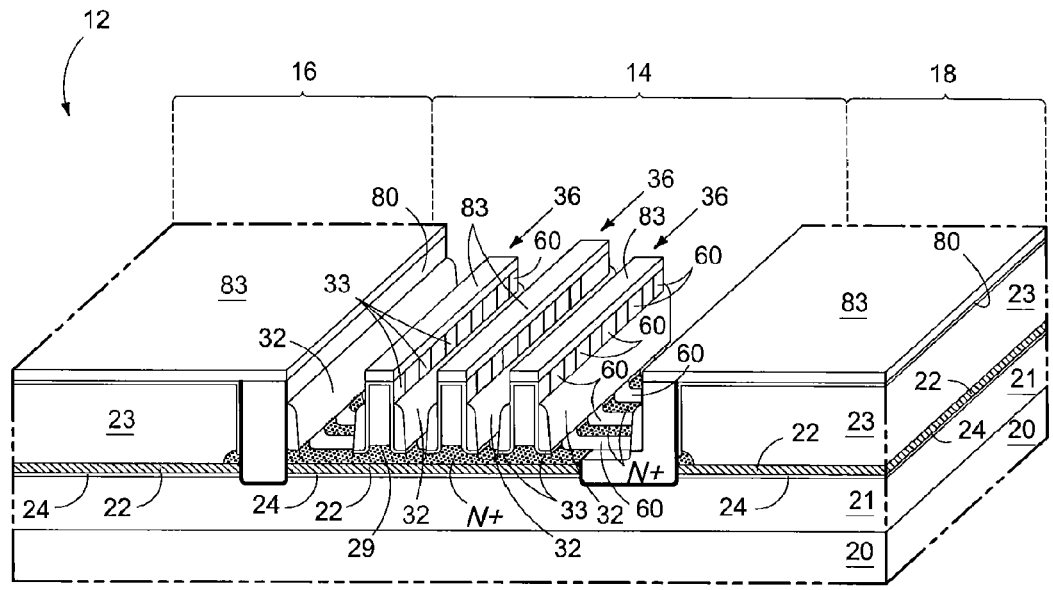
FIG. 9 is a view of the FIG. 8 substrate at a processing step subsequent to that shown by FIG. 8.

Processing may continue in fabrication of the example structure of FIG. 2. For example, the substrate of FIG. 8 may be covered with a thin blanketing nitride layer, followed by filling of the remaining void space with a spin-on dielectric. The resultant dielectric may be of the same composition as dielectric 60. Thereafter, such dielectric may be planarized back to stop on mask material 81. More nitride 83 may be deposited and the substrate patterned, for example as shown in FIG. 9 to form column lines 36. Pitch multiplication may be used. Exposed dielectric and exposed second semiconductor material 23 may be etched inwardly to the N+ regions. Gate dielectric 33 may then be formed, for example by selective oxidation. A suitable gate material 32 may be deposited over gate dielectric 33, and then spacer-etched. The spacer etching may over-etch into the N+ regions as shown. Regardless, N+ source/drain regions 29 may result.

Figure 10:
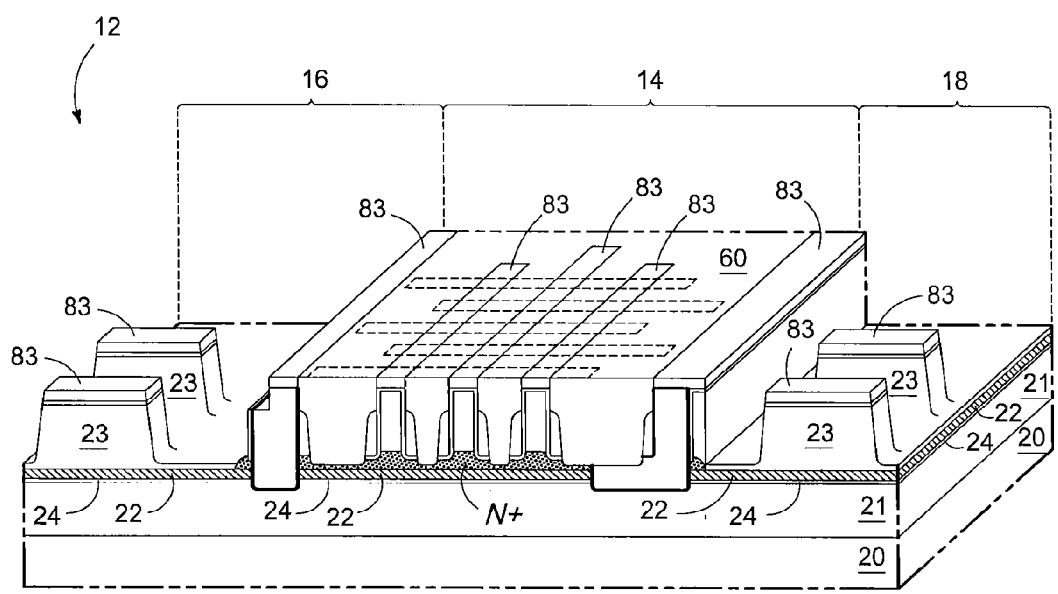
FIG. 10 is a view of the FIG. 9 substrate at a processing step subsequent to that shown by FIG. 9.

Referring to FIG. 10, the void space of FIG. 9 that was within array area 14 has been filled with dielectric 60. Further, second semiconductor material 23 within peripheral region(s) 16, 18 has been patterned for ultimate formation of spaced horizontal devices comprising floating bodies which include second semiconductor material 23.

Figure 11:
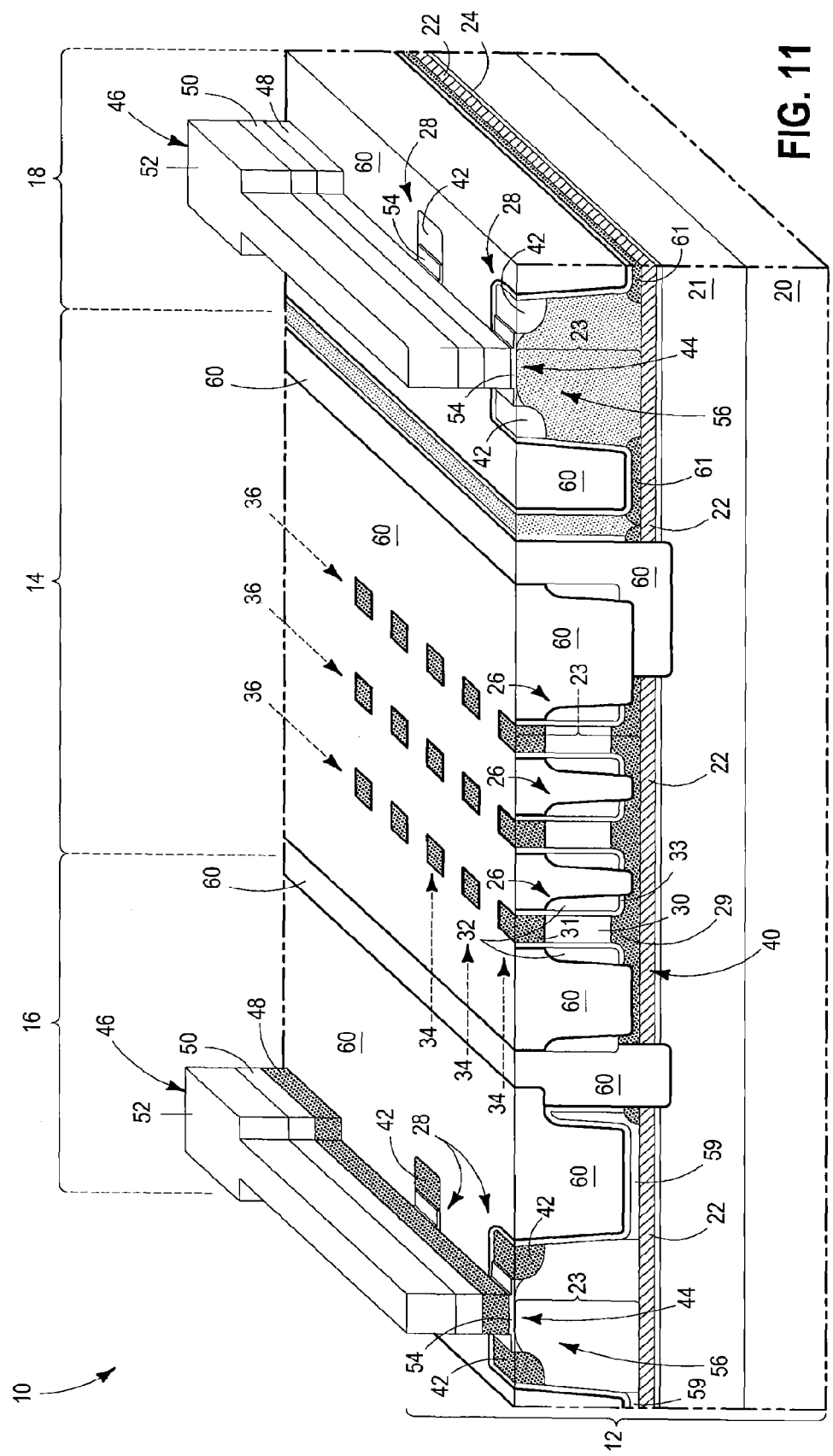
FIG. 11 is a view of the FIG. 10 substrate at a processing step subsequent to that shown by FIG. 10.

Referring to FIG. 11, suitable subsequent processing has occurred for formation of NMOS region 16 and PMOS region 18, including formation of gate constructions 46. If material 48 comprises conductively doped semiconductive material, such may be heavily doped n-type in NMOS peripheral region 16 and p-type in peripheral region 18. Dielectric material may be subsequently formed over dielectric material 60, with the example conductive contacts 65, 66, 68, 70 and 72 (FIG. 2) ultimately being formed. Some or all of the openings for the conductive contacts 65, 66, 68, 70 and 72 may be formed using a single masking step.

A method embodiment of the invention includes forming conductive contacts through dielectric material to the conductive material in the peripheral region and to the conductive material in the array region using only a single mask. For example referring to FIG. 2, a single mask may be used for forming one or both of conductive peripheral contacts 64, 65 and those of conductive contacts 70 using only a single mask. In one embodiment, such single masking step may also be used to form conductive contacts 66 in peripheral region(s) 16, 18 to source/drain regions 42 and conductive contact 68 to conductive material of gate constructions 46 using such single masking step. In one embodiment, lines 40 of conductive material 22 within array region 14 may be considered as horizontally elongated first conductive lines to which conductive contacts 70 are formed. Material 32 comprises horizontally elongated second conductive lines in array region 14 that are over first conductive lines 40. Conductive contacts 72 may be formed to second conductive lines 32 within array region 14 using such single masking step.

Conclusion

In some embodiments, a circuit structure comprises a substrate comprising an array region and a peripheral region. The substrate in the array and peripheral regions comprises insulator material over first semiconductor material, conductive material over the insulator material, and second semiconductor material over the conductive material. The array region comprises vertical circuit devices comprising the second semiconductor material. The peripheral region comprises horizontal circuit devices comprising the second semiconductor material. The horizontal circuit devices in the peripheral region individually comprise a floating body comprising the second semiconductor material. The conductive material in the peripheral region is under and electrically coupled to the second semiconductor material of the floating bodies. Conductive straps in the array region are under the vertical circuit devices. The conductive straps comprise the conductive material and individually are electrically coupled to a plurality of the vertical circuit devices in the array region.

In some embodiments, memory circuitry comprises a substrate comprising a memory array region and a peripheral region. The substrate in the peripheral and memory array regions comprises insulator material over first semiconductor material, conductive material over the insulator material, and second semiconductor material over the conductive material. The memory array region comprises a plurality of memory cells individually comprising a vertically oriented circuit device comprising the second semiconductor material. Horizontal circuit devices are included in the peripheral region which individually comprise a floating body comprising the second semiconductor material. The conductive material in the peripheral region is under and electrically coupled to the second semiconductor material of the floating bodies. The conductive material in the memory array region comprises individual access lines under and electrically coupled to rows of the vertically oriented circuit devices of the memory cells in the memory array region.

In some embodiments, memory circuitry comprises a substrate comprising a memory array region and a peripheral region. The substrate in the peripheral and memory array regions comprises insulator material over first semiconductor material, conductive material over the insulator material, and second semiconductor material over the conductive material. The memory array region comprises vertical transistors individually having a bottom source/drain region comprising the second semiconductor material, a top source/drain region comprising the second semiconductor material, and a channel region comprising the second semiconductor material between the top and bottom source/drain regions. Horizontal transistors are in the peripheral region and which individually comprise a floating body comprising the second semiconductor material. The conductive material in the peripheral region is under and electrically coupled to the second semiconductor material of the floating bodies. The conductive material in the memory array region comprises individual digit lines under and electrically coupled to the bottom source/drain regions of rows of the vertical transistors in the memory array region. Word lines are operatively laterally adjacent the channel regions of columns of the vertical transistors in the memory array region. Charge storage devices are individually electrically coupled to respective of the top source/drain regions.

In some embodiments, a method comprises forming a semiconductor-metal-on-insulator substrate having the semiconductor, conductive, and insulator materials extending from an array region to a peripheral region. At the same time, the conductive material is subtractively patterned within the array region and to separate the conductive material from being connected between the peripheral region and the array region.

In some embodiments, a method comprises forming a semiconductor-metal-on-insulator substrate having the semiconductor, conductive, and insulator materials extending from an array region to a peripheral region. The conductive material is subtractively patterned within the array region and to separate the conductive material from being connected between the peripheral region and the array region using a common masking step.

In some embodiments, a method comprises forming semiconductor material and conductive material of a semiconductor-metal-on-insulator substrate at the same levels and at the same time within a peripheral region and an array region of the substrate. Some of the conductive material within the array region is removed while leaving at least some of the conductive material in the peripheral region.

In some embodiments, a method comprises forming a semiconductor-metal-on-insulator substrate having the semiconductor, conductive, and insulator materials within an array region and a peripheral region. Conductive contacts are formed through dielectric material to the conductive material in the peripheral region and to the conductive material in the array region using only a single mask.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method, comprising:
forming a semiconductor-metal-on-insulator substrate having the semiconductor, conductive, and insulator materials extending from an array region to a peripheral region;
at the same time, subtractively patterning the conductive material within the array region and to separate the conductive material from being connected between the peripheral region and the array region; and
forming transistors in the peripheral region, the transistors individually comprising a floating body comprising the semiconductor material, the forming of the peripheral region transistors comprising:
forming the semiconductor material in the peripheral region to comprise a first dopant concentration first conductivity-type region that is elevationally over and directly against a second dopant concentration first conductivity-type region; and including forming the second dopant concentration to be higher than the first dopant concentration, forming the second dopant concentration region to be directly against the conductive material, and forming the second dopant concentration region to be discontinuous across the floating body.

2. The method of claim 1 wherein the patterning within the array region forms conductive lines; and further comprising:
forming a plurality of memory cells within the array region that are electrically coupled to the conductive lines.

3. A method, comprising:
forming a semiconductor-metal-on-insulator substrate having the semiconductor, conductive, and insulator materials extending from an array region to a peripheral region;
subtractively patterning the conductive material within the array region and separating the conductive material from being connected between the peripheral region and the array region using a common masking step; and
forming transistors in the peripheral region, the transistors individually comprising a floating body comprising the semiconductor material, the forming of the peripheral region transistors comprising:
forming the semiconductor material in the peripheral region to comprise a first dopant concentration first conductivity-type region that is elevationally over and directly against a second dopant concentration first conductivity-type region; and including forming the second dopant concentration to be higher than the first dopant concentration, forming the second dopant concentration region to be directly against the conductive material, and forming the second dopant concentration region to be discontinuous across the floating body.

4. The method of claim 3 comprising forming conductive contacts through dielectric material to the conductive material in the peripheral region and the conductive material in the array region using only a single mask after the common masking step.

5. A method comprising:
forming semiconductor material and conductive material of a semiconductor-metal-on-insulator substrate at the same levels and at the same time within a peripheral region and an array region of the substrate;
removing some of the conductive material within the array region while leaving at least some of the conductive material in the peripheral region; and
forming transistors in the peripheral region, the transistors individually comprising a floating body comprising the semiconductor material, the forming of the peripheral region transistors comprising:
forming the semiconductor material in the peripheral region to comprise a first dopant concentration first conductivity-type region that is elevationally over and directly against a second dopant concentration first conductivity-type region; and
including forming the second dopant concentration to be higher than the first dopant concentration, forming the second dopant concentration region to be directly against the conductive material, and forming the second dopant concentration region to be discontinuous across the floating body.

6. The method of claim 5 wherein the removing leaves at least a majority of the conductive material remaining in the peripheral region.

7. A method, comprising:
forming a semiconductor-metal-on-insulator substrate having the semiconductor, conductive, and insulator materials within an array region and a peripheral region;
forming transistors in the peripheral region, the transistors individually comprising a floating body comprising the semiconductor material, the forming of the peripheral region transistors comprising:
forming the semiconductor material in the peripheral region to comprise a first dopant concentration first conductivity-type region that is elevationally over and directly against a second dopant concentration first conductivity-type region; and including forming the second dopant concentration to be higher than the first dopant concentration, forming the second dopant concentration region to be directly against the conductive material, and forming the second dopant concentration region to be discontinuous across the floating body; and
forming conductive contacts through dielectric material to the conductive material in the peripheral region and to the conductive material in the array region using only a single mask.

8. The method of claim 7 comprising:
forming the transistors to be horizontal and comprise source/drain regions and gates in the peripheral region; and
forming conductive contacts in the peripheral region to the source/drain regions and to the gates using the single masking step.

9. The method of claim 7 comprising:
forming the conductive material within the array region into horizontally elongated first conductive lines to which the conductive contacts to the conductive material in the array region are formed;
forming horizontally elongated second conductive lines in the array peripheral that are over the first conductive lines; and
forming conductive contacts to the second conductive lines within the array region using the single masking step.

10. The method of claim 9 comprising:
forming the transistors to be horizontal and comprise source/drain regions and gates in the peripheral region; and
forming conductive contacts in the peripheral region to the source/drain regions and to the gates using the single masking step.

11. The method of claim 1 wherein the first-conductivity type is n.

12. The method of claim 11 comprising forming second conductivity-type transistors in the peripheral region.

13. The method of claim 1 wherein the first-conductivity type is p.

14. The method of claim 13 comprising forming second conductivity-type transistors in the peripheral region.

* * * * *